(12) United States Patent
Ma (10) Patent No.: US 8,803,871 B2
(45) Date of Patent: Aug. 12, 2014

(54) DISPLAY DEVICE, DRIVING METHOD THEREOF, AND SIGNAL CONTROLLER THEREFOR

(75) Inventor: Won-Seok Ma, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 1601 days.

(21) Appl. No.: 11/930,249

(22) Filed: Oct. 31, 2007

(65) Prior Publication Data

US 2008/0170062 A1 Jul. 17, 2008

(30) Foreign Application Priority Data

Jan. 17, 2007 (KR) .................. 10-2007-0005191

(51) Int. Cl.
*G06F 3/038* (2013.01)
*G09G 5/00* (2006.01)
*G06T 11/20* (2006.01)

(52) U.S. Cl.
USPC ............. 345/214; 345/98; 345/204; 345/440

(58) Field of Classification Search
USPC ................................................ 345/204–215
See application file for complete search history.

(56) References Cited

U.S. PATENT DOCUMENTS

| | | | |
|---|---|---|---|
| 5,987,543 A | 11/1999 | Smith | |
| 6,295,048 B1 * | 9/2001 | Ward et al. | 715/785 |
| 6,532,024 B1 * | 3/2003 | Everett et al. | 715/716 |
| 2002/0051511 A1 * | 5/2002 | Kataoka | 375/376 |
| 2003/0067454 A1 * | 4/2003 | Shin et al. | 345/204 |
| 2003/0174134 A1 * | 9/2003 | Yano | 345/440 |
| 2005/0179782 A1 | 8/2005 | Endo | |
| 2005/0237304 A1 * | 10/2005 | Anandakumar et al. | 345/166 |
| 2006/0279506 A1 * | 12/2006 | Choi | 345/98 |

FOREIGN PATENT DOCUMENTS

| | | |
|---|---|---|
| JP | 1124035 A | 1/1999 |
| JP | 11265168 A | 9/1999 |
| JP | 2001175231 A | 6/2001 |
| JP | 2001222249 A | 8/2001 |
| JP | 2002204377 A | 7/2002 |
| JP | 2005006123 A | 1/2005 |
| JP | 2005260913 A | 9/2005 |
| JP | 2006267230 A | 10/2006 |
| KR | 20010070301 A | 7/2001 |
| KR | 100423135 B1 | 3/2004 |
| KR | 100454994 B1 | 10/2004 |
| KR | 100493106 B1 | 5/2005 |

* cited by examiner

*Primary Examiner* — Charles V Hicks
(74) *Attorney, Agent, or Firm* — Cantor Colburn LLP (57) ABSTRACT

A display device includes a display panel, a gate driver, a data driver, and a signal controller that receives digital input signals including an input control signal and an input image signal in series through two or less input terminals, and processes the input image signal and applies the processed input image signal to the data driver, wherein the signal controller includes a receiver receiving the input signals and a clock generator generating a clock signal based on the input control signal, the signal controller processing the input image signal in synchronization with the clock signal. Thus, the structure of the display device can be simplified while signal loss and noises can be reduced.

19 Claims, 7 Drawing Sheets

DISPLAY DEVICE, DRIVING METHOD THEREOF, AND SIGNAL CONTROLLER THEREFOR

This application claims priority to Korean Patent Application No. 10-2007-0005191, filed on Jan. 17, 2007, and all the benefits accruing therefrom under 35 U.S.C. §119, the contents of which in its entirety are herein incorporated by reference.

BACKGROUND OF THE INVENTION (a) Field of the Invention

The present invention relates to a display device, a driving method of a display device, such as a liquid crystal display ("LCD"), and a signal controller for a display device. More particularly, the present invention relates to a display device having a simplified structure capable of reducing noise, a driving method of the display device, and a signal controller for the display device.

(b) Description of the Related Art

A display device is widely used as a desktop monitor or as a visual interface of a laptop computer. Recently, flat panel displays such as a plasma display panel ("PDP"), an organic light emitting display, and a liquid crystal display ("LCD") have been actively developed as substitutes for the cathode ray tube ("CRT"), which is heavy and large-sized.

Such a flat panel display includes a plurality of pixels including an electro-optical active layer. For example, an organic light emitting display includes an organic light emitting material as the electro-optical active layer while an LCD includes a liquid crystal ("LC") layer.

The flat panel display includes a driving apparatus for receiving input image signals that represent the luminance of the respective pixels, and input control signals for controlling the input image signals from an external device and adequately processing them. The input signals are inputted to the driving apparatus in an analog mode or digital mode, and the structure of the driving apparatus is different according thereto.

In an analog mode, all input signals are inputted through one input terminal, and reproduced colors are close to natural. However, since all input signals are inputted in a synthesized state, a complicated circuit and a large capacity memory are required for decomposing the input signals, and the signal to noise ratio is relatively high.

In a digital mode, although the inner structure of the driving apparatus is relatively simple, the number of input pins is large depending on the bit number of input signals when the driving apparatus is implemented as a chip.

BRIEF SUMMARY OF THE INVENTION

Thus, the present invention provides a display device having a simplified structure capable of reducing noise therein.

The present invention also provides a method of driving a display device, such as a liquid crystal display ("LCD").

The present invention also provides a signal controller for the display device.

A display device according to exemplary embodiments of the present invention includes a display panel including a plurality of gate lines, a plurality of data lines, and a plurality of pixels displaying an image and connected to the gate lines and data lines, a gate driver applying gate signals to the gate lines, a data driver applying data voltages to the data lines, and a signal controller that receives digital input signals including input control signals and input image signals in series through two or less input terminals and processes the input image signals and applies processed input image signals to the data driver, the signal controller controlling the gate driver and the data driver, wherein the signal controller includes a receiver receiving the digital input signals and a clock generator generating a clock signal based on the input control signals, the signal controller processing the input image signals in synchronization with the clock signal.

The number of the input terminals may be two, and the input signals may be inputted in differential signaling. The input image signals may be inputted in a plurality of packets, and the input control signals may be inputted between the packets of the input image signals.

The input control signals may include a first synchronization signal distinguishing between frames, and a second synchronization signal distinguishing between the packets of the input image signals in a frame. The first synchronization signal and the second synchronization signal may have a different number of pulses from each other, and a pulse waveform of the first synchronization signal may be substantially the same as a pulse waveform of the second synchronization signal.

The receiver may supply one signal selected from the first synchronization signal and the second synchronization signal, without distinction between the first synchronization signal and the second synchronization signal, to the clock generator as a reference signal. The reference signal may be in synchronization with the clock signal.

The clock generator may include a phase-locked loop ("PLL"). The clock generator may include a comparator receiving the reference signal and comparing the reference signal with a frequency-divided signal of the clock signal, a low pass filter filtering an output signal of the comparator, and a voltage-controlled oscillator receiving an output signal of the low pass filter and generating the clock signal and the frequency-divided signal.

The display device may be an LCD.

A driving method of a display device including a signal controller according to exemplary embodiments of the present invention includes receiving digital input signals including input control signals and input image signals through two or less input terminals of the signal controller, and processing the input image signals in synchronization with a clock signal, wherein the signal controller includes a receiver receiving the digital input signals and a clock generator generating the clock signal based on the input control signals.

The digital input signals may be inputted in differential signaling, and the input control signals may include a first synchronization signal distinguishing between frames and a second synchronization signal distinguishing between packets of the input image signals in a frame.

The receiver may supply one signal selected from the first synchronization signal and the second synchronization signal, without distinction between them, to the clock generator as a reference signal, the first synchronization signal and the second synchronization signal having a different number of pulses from each other, and a pulse waveform of the first synchronization signal may be substantially the same as a pulse waveform of the second synchronization signal.

The clock generator may receive the reference signal, compare the reference signal with a frequency-divided signal of the clock signal, and output an output signal, filter the output signal, and receive a filtered output signal and generate the clock signal and the frequency-divided signal.

A signal controller for a display device according to exemplary embodiments of the present invention may include no more than two input terminals receiving digital input signals, the digital input signals including input control signals and input image signals, a receiver receiving the digital input signals inputted in differential signaling, a clock generator generating a clock signal based on a reference signal supplied by the receiver, wherein the signal controller processes the input image signals in synchronization with the clock signal.

The input control signals may include a first synchronization signal and a second synchronization signal, and the receiver may select one of the first synchronization signal and the second synchronization signal as the reference signal.

The clock generator may include a comparator receiving the reference signal and comparing the reference signal with a frequency-divided signal of the clock signal, a low pass filter filtering an output signal of the comparator, and a voltage-controlled oscillator receiving an output signal of the low pass filter and generating the clock signal and the frequency-divided signal.

The reference signal may be in synchronization with the clock signal. The signal controller may be formed on a driver integrated circuit ("IC") chip.

BRIEF DESCRIPTION OF THE DRAWINGS

The above and other features and advantages of the present invention will become more apparent by describing in further detail exemplary embodiments thereof with respect to the accompanying drawings, in which.

DETAILED DESCRIPTION OF THE INVENTION

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

First, a liquid crystal display ("LCD") according to an exemplary embodiment of the present invention will be described in detail with reference to FIG. 1 to FIG. 3.

Figure 1:
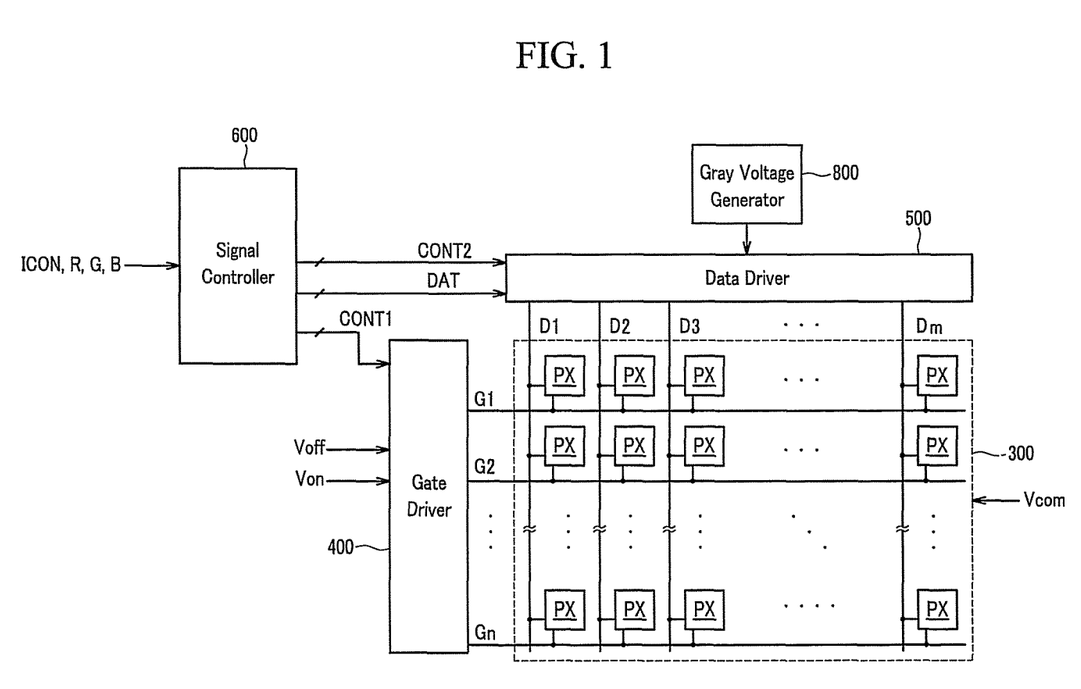
FIG. 1 is a block diagram of an exemplary display device according to an exemplary embodiment of the present invention.
Figure 2:
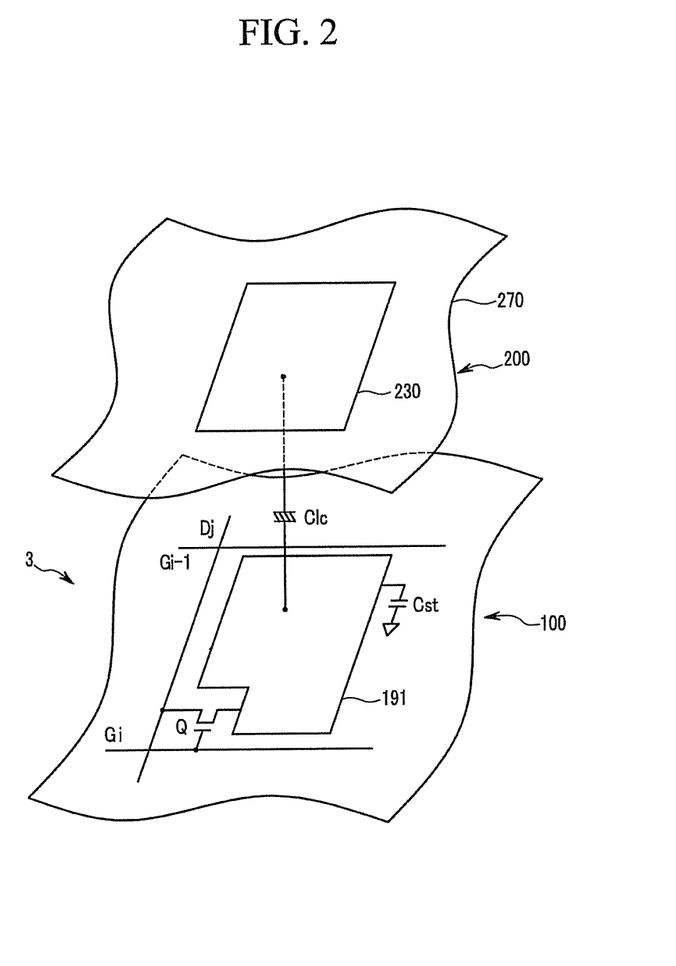
FIG. 2 is an equivalent circuit diagram of an exemplary pixel of an exemplary LCD according to an exemplary embodiment of the present invention.
Figure 3:
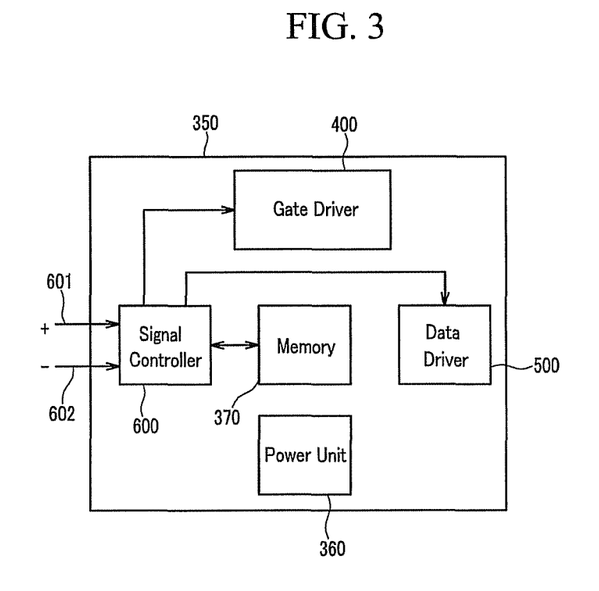
FIG. 3 is a block diagram of an exemplary integrated circuit ("IC") for driving an exemplary LCD according to an exemplary embodiment of the present invention.

FIG. 1 is a block diagram of an exemplary LCD according to an exemplary embodiment of the present invention, FIG. 2 is an equivalent circuit diagram of an exemplary pixel of an exemplary LCD according to an exemplary embodiment of the present invention, and FIG. 3 is a block diagram of an exemplary driver integrated circuit ("IC") chip for an exemplary LCD according to an exemplary embodiment of the present invention.

Referring to FIG. 1, an LCD according to an exemplary embodiment of the present invention includes a liquid crystal ("LC") panel assembly 300, a gate driver 400, a data driver 500, a gray voltage generator 800, and a signal controller 600.

The LC panel assembly 300 includes a plurality of signal lines $G_1$-$G_n$ and $D_1$-$D_m$, and a plurality of pixels PX connected to the signal lines $G_1$-$G_m$ and $D_1$-$D_m$ and arranged substantially in a matrix, as seen in the diagram of FIG. 1. Further, the LC panel assembly 300 includes lower and upper panels 100 and 200 facing each other and an LC layer 3 interposed therebetween, in the view shown in FIG. 2.

The signal lines $G_1$-$G_n$ and $D_1$-$D_m$ provided on the lower panel 100 include a plurality of gate lines $G_1$-$G_n$ for transmitting gate signals (also referred to as "scanning signals") and a plurality of data lines $D_1$-$D_m$ for transmitting data voltages. The gate lines $G_1$-$G_n$ extend substantially in a row direction, such as a first direction, and are substantially parallel to each other, and the data lines $D_1$-$D_m$ extend substantially in a column direction, such as a second direction, and are substantially parallel to each other. The first direction may be substantially perpendicular to the second direction.

Each pixel PX, for example a pixel PX connected to the i-th (i=1, 2, . . . , n) gate line $G_i$ and the j-th (j=1, 2, . . . , m) data line $D_j$, includes a switching element Q connected to the signal lines $G_i$ and $D_j$, and an LC capacitor Clc and a storage capacitor Cst connected to the switching element Q. In alternative embodiments, if the storage capacitor Cst is unnecessary, then it may be omitted.

The switching element Q is a three-terminal element such as a thin film transistor ("TFT") provided on the lower panel 100, and it has a control terminal, such as a gate electrode, connected to the gate line $G_i$, an input terminal, such as a source electrode, connected to the data line $D_j$, and an output terminal, such as a drain electrode, connected to the LC capacitor Clc and the storage capacitor Cst.

The LC capacitor Clc includes a pixel electrode 191 provided on the lower panel 100 and a common electrode 270 provided on the upper panel 200 as its two terminals, and the LC layer 3 interposed between the two electrodes 191 and 270 functions as a dielectric of the LC capacitor Clc. The pixel electrode 191 is connected to the switching element Q, such as to the output terminal of the switching element Q, and the common electrode 270 covers the entire surface, or substantially the entire surface, of the upper panel 200 and is supplied with a common voltage Vcom. In an alternative exemplary embodiment, unlike FIG. 2, the common electrode 270 may be provided on the lower panel 100, and in this case, at least one of the two electrodes 191 and 270 may have a shape of a bar or a stripe.

The storage capacitor Cst is an auxiliary capacitor for the LC capacitor Clc and formed by overlapping a separate signal line (not shown) with the pixel electrode 191 via an insulator interposed therebetween. The separate signal line is provided on the lower panel 100 and supplied with a predetermined voltage such as a common voltage Vcom. Alternatively, the storage capacitor Cst may be formed by overlapping the pixel electrode 191 with a previous gate line $G_{i-1}$ disposed right above via an insulator.

In order to implement color display, each pixel PX uniquely displays one color in a set of colors (spatial division) or each pixel PX sequentially displays the colors in turn (temporal division) such that a spatial or temporal sum of the colors may be recognized as a desired color. An example of a set of the colors may include primary colors, and may include red, green, and blue. FIG. 2 shows an example of the spatial division in which each pixel PX includes a color filter 230, which represents one color in the set of colors, in an area of the upper panel 200 facing the pixel electrode 191. In an alternative exemplary embodiment, unlike FIG. 2, the color filter 230 may be provided on or under the pixel electrode 191 on the lower panel 100.

At least one polarizer (not shown) is provided in the LC panel assembly 300. For example, first and second polarized films may be attached to the lower and upper panels 100, 200, respectively, and the polarized films may adjust a transmission direction of light externally provided into the lower and upper panels 100, 200, in accordance with an aligned direction of the LC layer 3. In such a case, the first and second polarized films may have first and second polarized axes thereof substantially perpendicular to each other.

Referring to FIG. 1 again, the gray voltage generator 800 generates all gray voltages or a limited number of gray voltages (hereinafter referred to as "reference gray voltages") related to the transmittance of the pixels PX. Some of the (reference) gray voltages have a positive polarity relative to the common voltage Vcom, and the other of the (reference) gray voltages have a negative polarity relative to the common voltage Vcom.

The gate driver 400 is connected to the gate lines $G_1$-$G_n$ of the LC panel assembly 300 and synthesizes a gate-on voltage Von for applying to the control terminal of the switching element Q for turning on the switching element Q and a gate-off voltage Voff for turning off the switching element Q to generate the gate signals for application to the gate lines $G_1$-$G_n$.

The data driver 500 is connected to the data lines $D_1$-$D_m$ of the LC panel assembly 300 and applies data voltages, which are selected from the gray voltages supplied from the gray voltage generator 800, to the data lines $D_1$-$D_m$. However, in the case when the gray voltage generator 800 supplies only a limited number of reference gray voltages rather than supplying all gray voltages, the data driver 500 divides the reference gray voltages to generate desired data voltages. The data voltages are then applied to the input terminal of a turned-on switching element Q.

The signal controller 600 controls the gate driver 400, the data driver 500, and so forth. The signal controller 600 will be described in further detail later.

Two or more of such driving apparatus 400, 500, 600, and 800 may be integrated into a single chip, an example of which is illustrated in FIG. 3.

FIG. 3 illustrates an exemplary driver IC chip 350 for an exemplary LCD according to an exemplary embodiment of the present invention, and the IC chip 350 includes a signal controller 600, a gate driver 400, and a data driver 500. The IC chip 350 also includes a power unit 360 supplying power to the chip 350 and a memory 370. In an alternative exemplary embodiment, the gray voltage generator 800 may also be included within the chip 350. Input terminals 601, 602 of the signal controller 600 will be further described below with respect to FIG. 4

In other alternative exemplary embodiments, each of the driving apparatus 400, 500, 600, and 800 may include at least one IC chip mounted on the LC panel assembly 300 or on a flexible printed circuit film (not shown) in a tape carrier package ("TCP") type, which is attached to the LC panel assembly 300. In still other alternative exemplary embodiments, the driving apparatus 400, 500, 600, and 800 may be mounted on a separate printed circuit board ("PCB") (not shown). In yet other alternative exemplary embodiments, the driving apparatus 400, 500, 600, and 800 may be integrated onto the LC panel assembly 300 along with the signal lines $G_1$-$G_n$ and $D_1$-$D_m$ and the TFT switching elements Q.

A configuration of a signal controller according to an exemplary embodiment of the present invention and an operation of an LCD including the same will now be described in detail with reference to FIG. 4 to FIG. 7.

Figure 4:
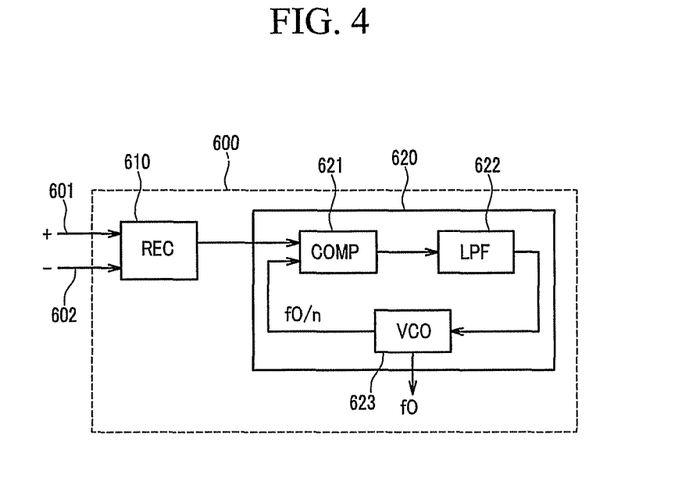
FIG. 4 is a block diagram of an exemplary signal controller according to an exemplary embodiment of the present invention.
Figure 5:
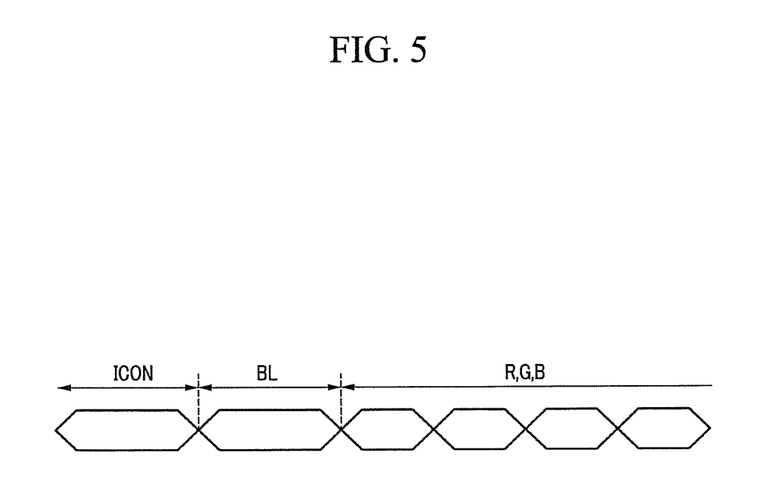
FIG. 5 is a waveform diagram of an input signal of an exemplary signal controller according to an exemplary embodiment of the present invention; and, FIG. 6 and FIG. 7 are waveform diagrams each illustrating an example of the input signal shown in FIG. 5.
Figure 6:
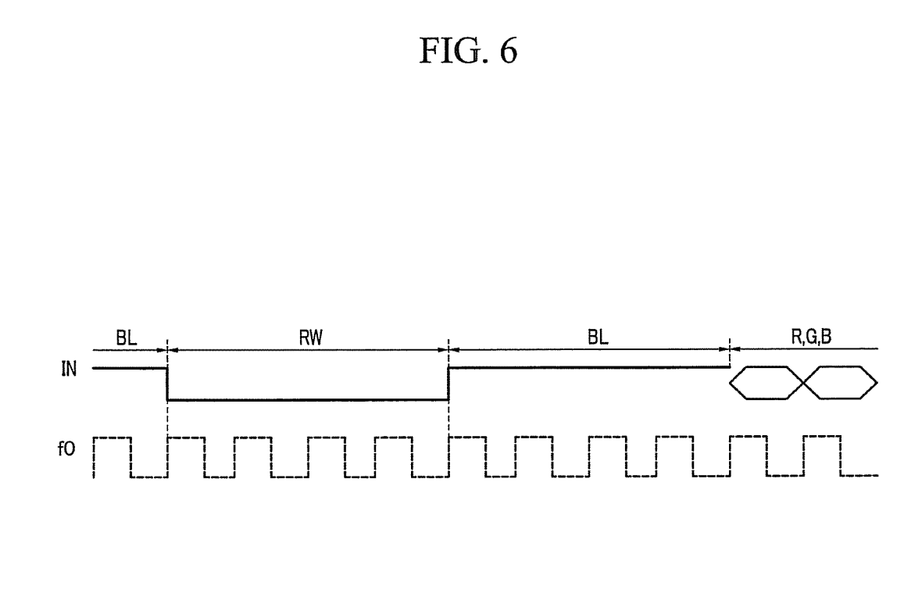
Figure 7:
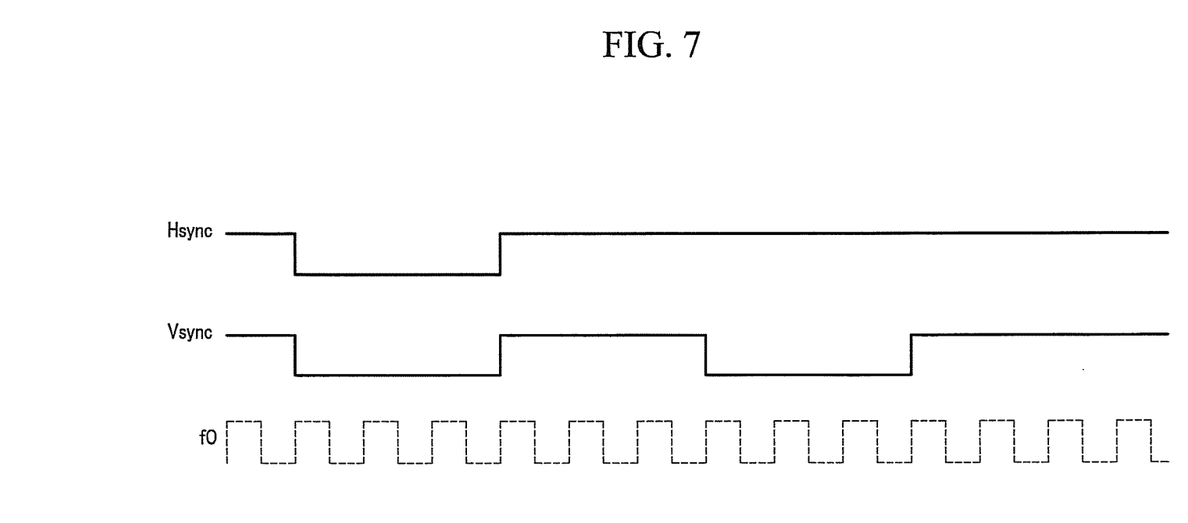

FIG. 4 is a block diagram of an exemplary signal controller according to an exemplary embodiment of the present invention, FIG. 5 is a waveform diagram of an input signal of an exemplary signal controller according to an exemplary embodiment of the present invention, and FIG. 6 and FIG. 7 show examples of waveforms of such an input signal.

As shown in FIG. 4, the signal controller 600 according to an exemplary embodiment of the present invention includes a receiver REC 610 receiving an input signal and a clock generator 620 generating a clock signal fO. The signal controller 600 includes a pair of serial input terminals 601 and 602. The clock generator 620, for example a phase-locked loop ("PLL") generator, includes a comparator COMP 621, a low pass filter LPF 622, and a voltage-controlled oscillator VCO 623. The comparator 621 is connected to the receiver 610, the low pass filter 622 to the comparator 621, and the voltage-controlled oscillator 623 to the low pass filter 622 and the comparator 621.

The signal controller 600 receives various kinds of digital input signals from an external graphics controller (not shown) through the input terminals 601 and 602. Examples of the input signals applied to the signal controller 600 include input image signals R, G, and B and input control signals ICON controlling the display of the input image signals R, G, and B.

An input image signal R, G, and B includes luminance information for a pixel PX, and the luminance has a predetermined number of grays, for example, 1024 ($=2^{10}$), 256 ($=2^8$), or 64 ($=2^6$) grays.

The input control signals ICON include, for example, synchronization signals such as a vertical synchronization signal Vsync and a horizontal synchronization signal Hsync. The vertical synchronization signal Vsync divides the input image signals R, G, and B by frames, that is, by images. The horizontal synchronization signal Hsync divides input image signals R, G, and B for a frame into several packets. For example, input image signals R, G, and B for pixels of the respective rows are divided by the horizontal synchronization signal Hsync.

The input image signals R, G, and B and the input control signals ICON are inputted to the input terminals 601 and 602 in series with a low-voltage differential signaling ("LVDS") method.

Here, in the differential signaling method, the magnitudes of the input signals inputted to the two input terminals 601 and 602 are different from each other. For example, if a signal inputted to one input terminal 601 has a positive (+) value relative to a reference value, for example zero, then a corresponding signal inputted to the other input terminal 602 has a negative (−) value.

When the differential signaling method is adopted, the receiver 610 of the signal controller 600 synthesizes signals from both input terminals 601 and 602 to determine input information.

In this manner, even if the voltage range of a signal inputted through each input terminal 601 and 602 is small, information is not lost. Also, since the sum of the voltages of signals inputted through the two input terminals 601 and 602 is always equal to zero, electromagnetic interference is reduced. Therefore, input signals can be transmitted without loss or noise even though the frequency increases when the input signals are transmitted in series through only two input terminals 601 and 602, as compared to when input signals are transmitted through three or more input terminals.

Further, the number of input terminals may be one when digital input signals are used, which still provides the signal controller 600 with a simplified structure even though the differential signaling method is not adopted.

Referring to FIG. 5, input image signals R, G, and B for a series of pixels, for example a row of pixels, form a packet to be transmitted successively to the signal controller 600. Here, a break signal BL is disposed between the packets of the input image signals R, G, and B. An input control signal ICON is inserted within the break signal BL, such as in the middle or substantially in the middle of the break signal BL.

Referring to the input signal IN shown in FIG. 6, a reference signal RW, which is a reference to a clock signal fO generated at the clock generator 620, is included in the input control signal ICON, which is inserted within the break signal BL.

The reference signal RW is extracted by the receiver 610 to be inputted to the comparator 621 of the clock generator 620, and an output signal of the comparator 621 reaches the voltage-controlled oscillator 623 via the low pass filter 622. The voltage-controlled oscillator 623 generates a clock signal fO based on the output signal of the comparator 621, and inputs a frequency-divided signal fO/n, obtained by frequency-dividing the clock signal fO, to the comparator 621. The comparator 621 compares the frequency-divided signal fO/n with the reference signal RW and outputs the result to the low pass filter 622. Through this process, the clock signal fO generated at the clock generator 620 can be stably synchronized with the reference signal RW as shown in FIG. 6.

Such a reference signal RW may be generated separately from the synchronization signals Vsync and Hsync of the input control signals ICON, but in an alternative exemplary embodiment, the synchronization signals Vsync and Hsync may be used as the reference signal RW. The vertical synchronization signal Vsync and the horizontal synchronization signal Hsync may have pulse waveforms of the same duration, wherein the two signals are distinguished from each other by the number of pulses therein. In the example shown in FIG. 7, the horizontal synchronization signal Hsync has only one pulse, while the vertical synchronization signal Vsync has two pulses. As is further shown in FIG. 7, the clock signal fO is synchronized with both of the horizontal and vertical synchronization signals Hsync and Vsync.

In this manner, the receiver 610 can input any one of the horizontal synchronization signal Hsync and the vertical synchronization signal Vsync to the clock generator 620 as a reference signal RW without distinguishing between them. In other words, since the same pulse waveform is inputted to the clock generator 620 as a reference signal RW whether the horizontal synchronization signal Hsync is inputted or the vertical synchronization signal Vsync is inputted as a reference signal RW, the clock signal fO also remains uniform.

In synchronization with the clock signal fO, the signal controller 600 appropriately processes the input image signals R, G, and B to be suitable for the operating condition of the LC panel assembly 300 and generates gate control signals CONT1 for controlling the gate driver 400 and data control signals CONT2 for controlling the data driver 500, as shown in FIG. 1.

The gate control signals CONT1 include a scanning start signal STV for instructing to start scanning, and at least one clock signal for controlling the output time of a gate-on voltage Von. The gate control signals CONT1 may further include an output enable signal OE for defining the duration of the gate-on voltage Von.

The data control signals CONT2 include a horizontal synchronization start signal STH for indicating a start to transmit digital image signals DAT for a row of pixels PX, a load signal LOAD for instructing to apply analog data voltages to the data lines $D_1$-$D_m$, and a data clock signal HCLK. The data control signals CONT2 may further include an inversion signal RVS for reversing the polarity of data voltages relative to a common voltage Vcom (hereinafter, "the polarity of a data voltage relative to the common voltage Vcom" is referred to as "the polarity of the data voltage").

The signal controller 600 transmits the gate control signals CONT1 to the gate driver 400, and transmits the processed image signals DAT and the data control signals CONT2 to the data driver 500.

Responding to the data control signals CONT2 from the signal controller 600, the data driver 500 receives digital image signals DAT for a row of pixels PX, converts the digital image signals DAT into analog data voltages selected from the gray voltages from the gray voltage generator 800, and then applies the analog data voltages to the corresponding data lines $D_1$-$D_m$.

The gate driver 400 applies the gate-on voltage Von to the gate lines $G_1$-$G_n$ in response to the gate control signals CONT1 from the signal controller 600, thereby turning on the switching elements Q connected to the gate lines $G_1$-$G_n$. Then, data voltages applied to the data lines $D_1$-$D_m$ are applied to the corresponding pixels PX through the turned-on switching elements Q.

The difference between the data voltage applied to a pixel PX and the common voltage Vcom is represented as a voltage across the LC capacitor Clc of the pixel, that is, a pixel voltage. The LC molecules within the LC layer 3 have orientations depending on the magnitude of the pixel voltage, and the molecular orientations determine the polarization of light passing through the LC layer 3. The polarizer(s) converts the light polarization into the light transmittance such that the pixel PX has a luminance represented by a gray of an image signal DAT.

By repeating this procedure by a unit of a horizontal period (which is also denoted as "1H" and is equal to one period of the horizontal synchronization signal Hsync and the data enable signal DE), all gate lines $G_1$-$G_n$ are sequentially supplied with the gate-on voltage Von, thereby applying the data voltages to all pixels PX to display an image for a frame.

When the next frame starts after one frame finishes, the inversion signal RVS applied to the data driver 500 is controlled such that the polarity of a data voltage applied to each of the pixels PX is reversed to be opposite to the polarity of the previous frame (which is referred to as "frame inversion"). Also, even in one frame, the polarity of a data voltage applied to a data line may periodically vary (for example row inversion or dot inversion) or the polarities of data voltages applied to a pixel row may be different from each other (for example column inversion or dot inversion) in accordance with the characteristics of the inversion signal RVS.

In this manner, by receiving digital input signals of a low voltage through two or less input terminals, the structure of a display device, such as an LCD, can be simplified while signal loss and noises can be reduced. Also, a driving method of the display device is made possible which reduces signal loss and noise in the display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display panel including a plurality of gate lines, a plurality of data lines, and a plurality of pixels displaying an image and connected to the gate lines and data lines;
a gate driver which applies gate signals to the gate lines;
a data driver which applies data voltages to the data lines; and
a signal controller that receives digital input signals including input control signals and input image signals in series through two or less input terminals, and processes the input image signals and applies processed input image signals to the data driver, the signal controller controlling the gate driver and the data driver,
wherein the signal controller comprises a receiver receiving the digital input signals in series and a clock generator generating a clock signal based on the input control signals, the signal controller processing the input image signals in synchronization with the clock signal,
wherein the input image signals are inputted in a plurality of packets, and a break signal is disposed between the packets of the input image signals, and the input control signals are inserted within the break signal.

2. The display device of claim 1, wherein a number of the input terminals of the signal controller is two, and the digital input signals are inputted in differential signaling.

3. The display device of claim 1, wherein the input control signals include a first synchronization signal distinguishing between frames and a second synchronization signal distinguishing between the packets of the input image signals in a frame.

4. The display device of claim 3, wherein the first synchronization signal and the second synchronization signal have a different number of pulses from each other, and
a pulse waveform of the first synchronization signal is substantially same as a pulse waveform of the second synchronization signal.

5. The display device of claim 4, wherein the receiver supplies one signal selected from the first synchronization signal and the second synchronization signal, without distinction between the first synchronization signal and the second synchronization signal, to the clock generator as a reference signal.

6. The display device of claim 5, wherein the reference signal is in synchronization with the clock signal.

7. The display device of claim 6, wherein the clock generator comprises a phase-locked loop.

8. The display device of claim 7, wherein the clock generator comprises:
a comparator receiving the reference signal and comparing the reference signal with a frequency-divided signal of the clock signal;
a low pass filter filtering an output signal of the comparator; and
a voltage-controlled oscillator receiving an output signal of the low pass filter and generating the clock signal and the frequency-divided signal.

9. The display device of claim 1, wherein the display device is a liquid crystal display device.

10. The display device of claim 1, wherein the input control signals include a reference signal, and the reference signal is in synchronization with the clock signal.

11. A driving method of a display device including a signal controller, the method comprising:
receiving digital input signals including input control signals and input image signals in series through two or less input terminals of the signal controller; and
processing the input image signals in synchronization with a clock signal, wherein the signal controller includes a receiver receiving the digital input signals in series and a clock generator generating the clock signal based on the input control signals, wherein the input image signals are inputted in a plurality of packets, and a break signal is disposed between the packets of the input image signals, and the input control signals are inserted within the break signal.

12. The driving method of claim 11, wherein the digital input signals are inputted in differential signaling, and the input control signals comprise a first synchronization signal distinguishing between frames and a second synchronization signal distinguishing between packets of the input image signals in a frame.

13. The driving method of claim 12, wherein the receiver supplies one signal selected from the first synchronization signal and the second synchronization signal, without distinction between them, to the clock generator as a reference signal, the first synchronization signal and the second synchronization signal having a different number of pulses from each other; and
a pulse waveform of the first synchronization signal is substantially same as a pulse waveform of the second synchronization signal.

14. The driving method of claim 13, wherein the clock generator:
receives the reference signal, compares the reference signal with a frequency-divided signal of the clock signal, and outputs an output signal;
filters the output signal; and
receives a filtered output signal and generates the clock signal and the frequency-divided signal.

15. A signal controller for a display device, the signal controller comprising:
no greater than two input terminals receiving digital input signals in series, the digital input signals including input control signals and input image signals;
a receiver receiving the digital input signals in series from the input terminals, the digital input signals inputted in differential signaling; and
a clock generator generating a clock signal based on a reference signal supplied by the receiver;
wherein the signal controller processes the input image signals in synchronization with the clock signal,
wherein the input image signals are inputted in a plurality of packets, and a break signal is disposed between the packets of the input image signals, and the input control signals are inserted within the break signal.

16. The signal controller of claim 15, wherein the input control signals include a first synchronization signal and a second synchronization signal, and the receiver selects one of the first synchronization signal and the second synchronization signal as the reference signal.

17. The signal controller of claim 15, wherein the clock generator comprises:
a comparator receiving the reference signal and comparing the reference signal with a frequency-divided signal of the clock signal;
a low pass filter filtering an output signal of the comparator; and
a voltage-controlled oscillator receiving an output signal of the low pass filter and generating the clock signal and the frequency-divided signal.

18. The signal controller of claim 15, wherein the reference signal is in synchronization with the clock signal.

19. The signal controller of claim 15, wherein the signal controller is formed on a driver integrated circuit chip.

* * * * *